United States Patent
Andreev et al.

(10) Patent No.: US 7,415,686 B2
(45) Date of Patent: Aug. 19, 2008

(54) MEMORY TIMING MODEL WITH BACK-ANNOTATING

(75) Inventors: Alexander Andreev, San Jose, CA (US); Anatoli A. Bolotov, Cupertino, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 270 days.

(21) Appl. No.: 11/311,388

(22) Filed: Dec. 19, 2005

(65) Prior Publication Data

US 2007/0143648 A1  Jun. 21, 2007

(51) Int. Cl.
*G06F 17/50* (2006.01)
*G06F 9/45* (2006.01)
*G11C 29/00* (2006.01)

(52) U.S. Cl. .................. 716/6; 716/4; 714/718

(58) Field of Classification Search .......... 716/4, 716/6; 714/18, 718
See application file for complete search history.

(56) References Cited

U.S. PATENT DOCUMENTS

| | | | | |
|---|---|---|---|---|
| 6,249,901 | B1 * | 6/2001 | Yuan et al. | 716/5 |
| 6,553,552 | B1 * | 4/2003 | Khan et al. | 716/10 |
| 6,813,201 | B2 * | 11/2004 | Zarrineh et al. | 365/201 |
| 7,031,898 | B2 * | 4/2006 | Jain et al. | 703/14 |

* cited by examiner

*Primary Examiner*—Stacy A Whitmore
*Assistant Examiner*—Magid Y Dimyan
(74) *Attorney, Agent, or Firm*—Westman Champlin & Kelly, P.A.

(57) ABSTRACT

A memory timing model is provided, which includes an address input, a multiple-bit data input, a multiple-bit data output, a capacity C and a width N. N one-bit wide memory modules are instantiated in parallel with one another between respective bits of the data input and the data output. Each memory module has a capacity of C bits addressed by the address input.

25 Claims, 7 Drawing Sheets

US 7,415,686 B2

MEMORY TIMING MODEL WITH BACK-ANNOTATING

FIELD OF DISCLOSURE

The present disclosure relates to timing models for memories in integrated circuit designs.

BACKGROUND OF DISCLOSURE

When designing an integrated circuit, memory devices in a customer design are mapped to memory resources within an integrated circuit layout pattern. It is customary for the integrated circuit manufacturer to provide the customer with various tools and models for assisting the customer in designing or customizing an integrated circuit for a particular application. Some integrated circuits have different types of memory resources and can include large arrays or matrices of standard memory elements. For example, in LSI Logic Corporations' RapidChip® Technology, tens or even hundreds of memories in a customer design can be mapped into matrices of standard Random Access Memories (e.g., RRAM) that are pre-defined in the layout pattern.

From a timing point of view, when a customer memory is mapped to a memory matrix, the memory is essentially substituted with a "mapped memory wrapper." The mapped memory wrapper includes a model of the memory itself and models of any input or output delays caused by mapping the memory into the memory matrix and by the particular tiling of the memory in that matrix. For example, the mapped memory wrapper can model delays introduced by any additional logic in the memory matrix and can model differences in delay caused by the manner in which the memory was tiled into the matrix. These delays and appropriate timing constraints can be generated by appropriate tools that perform the mapping procedure or are associated with such tools.

The straightforward usage of existing tools that provide memory timing models for timing stimulation are, however, often inconvenient under such conditions and somehow become even cumbersome because they are generally aimed at the memory module itself rather than its wrapper indicated above. Due to the size and complexity of large memory matrices, it can become difficult to generate accurate timing models and apply constraints for each input and output path through the matrix.

Improved memory timing models and methods of generating such models are therefore desired.

SUMMARY

One embodiment of the present invention is directed to a memory timing model, which includes an address input, a multiple-bit data input, a multiple-bit data output, a capacity C and a width N. N one-bit wide memory modules are instantiated in parallel with one another between respective bits of the data input and the data output. Each memory module has a capacity of C bits addressed by the address input.

Another embodiment of the present invention is directed to a method of creating a memory timing model for a memory device. The method includes: inputting a capacity C and a width N for the memory device; and instantiating N one-bit wide memory modules in parallel with one another between respective bits of a multiple-bit data input and a multiple-bit data output of the memory timing model, each memory module having a capacity of C bits addressed by an address input to the memory timing model.

Another embodiment of the present invention is directed to a computer-readable medium including a memory timing model. The memory timing model has an address input, a multiple-bit data input, a multiple-bit data output, a capacity C and a width N. N one-bit wide memory modules are instantiated in parallel with one another between respective bits of the data input and the data output. Each memory module has a capacity of C bits addressed by the address input.

DETAILED DESCRIPTION OF ILLUSTRATIVE EMBODIMENTS

Figure 1:
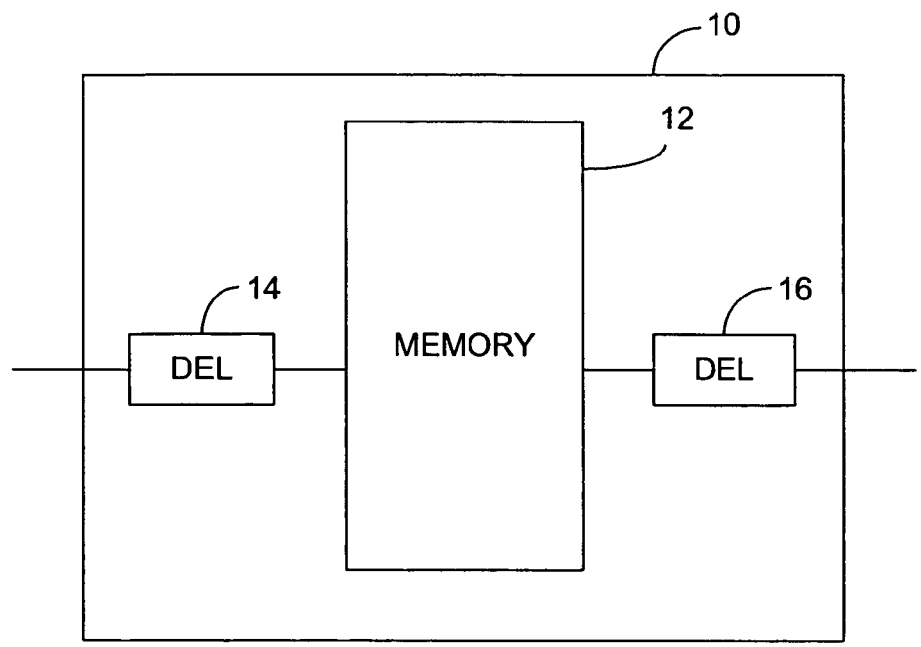
FIG. 1 is a diagram illustrating a mapped memory wrapper with which an embodiment of the present invention can be used.

The present disclosure illustrates a memory timing model with back-annotation (MBA). The model has a construction that allows accurate memory timing simulations for memories that are mapped to a memory resource on an integrated circuit layout pattern, such as a matrix of standard random access memories (RAMs), and more specifically reconfigurable matrix RAMs (RRAMs) for example. The memory timing model reflects the input and output signal delays of the matrix RAM and provides adequate responses to hazard conditions that can occur in a design, which propagate to its memories.

A. Memory Resources in Customizable Integrated Circuit Designs

Integrated circuits are generally fabricated on a thin silicon wafer or substrate. Semiconductor devices and electrical interconnections that form the integrated circuit are conventionally made by building many mask layers on top of one another on the substrate. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilcon gate electrodes. One or more metal and insulating layers are then deposited on top of the base layers and patterned to form conductive segments, which interconnect the various semiconductor devices formed in the base layers.

One or more embodiments of the present invention can be used with integrated circuits in which the features of the integrated circuit are pre-defined by the manufacturer, fully customizable or partly customizable. Several recent types of integrated circuits have been developed that have modules or blocks of transistors that are partly fixed and partly programmable and/or customizable. Field Programmable Gate Array (FPGA) refers to a type of logic chip in which all mask layers are pre-fabricated by an ASIC vendor and has a function that can be easily reprogrammed in the field with trivial modifications. An application specific integrated circuit (ASIC) is an integrated circuit designed specifically for a particular application or use. In a fully programmable ASIC, all mask layers are programmed or customized by the logic designer. A typical example of a fully programmable ASIC is a cell-based ASIC (CBIC). While a fully programmable ASIC efficiently uses power and area as compared to FPGAs, it is very complex to design and prototype. In a semi-programmable ASIC, some, but not all, mask layers are programmable. For example, some or all of the base layers are pre-fabricated by the ASIC vendor and the remaining layers, such as the metal layers, are programmed by the logic designer to interconnect the semiconductor elements to perform the desired function. A typical example of a semi-programmable ASIC is a gate-array-based ASIC.

Accordingly, semi-programmable ASICs have recently become more popular. Integrated circuit foundries have begun to develop standard, or base, platforms, known as "slices" comprising the base layers of an integrated circuit but without the metal interconnection layers. The base layers are patterned to form gates that can be configured into cells using tools supplied by the foundry. The chip designer designs additional metal layers for the base platform to thereby configure the integrated circuit into a custom ASIC employing the customer's intellectual property. An example of such configurable base platform is the RapidChip® Platform available from LSI Logic Corporation of Milpitas, Calif.

An embodiment of the present invention is directed to a method and apparatus for generating timing models for customer memories (or other functional blocks) that are mapped to an integrated circuit layout pattern, such as the layout pattern of an integrated circuit having modules or blocks of transistors that are partly fixed and partly programmable and/or customizable. For example, a base platform for an integrated circuit can include Reconfigurable RAM (RRAM). RRAM includes sets of memories of the same type that are placed compactly within a memory matrix. An RRAM, as the term is used herein, is a megacell that can be considered as a set of memories with built-in self-testing and/or built-in self-correction. The base platform might also contain single diffused memories, rcell memories and/or flip-flop rcell memories defined within the transistor fabric of the base platform, for example.

Single-diffused memories are memories that are pre-diffused on the base platform slice. For example, a base platform can include arrays of fixed random access memory (RAM). Each RAM instance can be self-contained and can have its own built-in self-test (BIST) circuitry, decoupling capacitances and hard macro that snaps to locations in the layout floorplan. In some base platforms, RAM resources are consolidated in a number of small regions called RRAM matrices to share overhead and reduce area wastage. An example of a memory matrix is described in U.S. application Ser. No. 10/875,128, filed Jun. 23, 2004 and entitled YIELD DRIVEN MEMORY PLACEMENT SYSTEM, and U.S. Pat. No. 6,084,811 entitled PROCESS FOR LAYOUT OF MEMORY MATRICES IN INTEGRATED CIRCUITS.

An rcell is a basic unit within the transistor fabric. An rcell is made up of "N" and "P" type transistors. Rcells are generally diffused in a regular pattern throughout the slice and are arranged to implement efficiently both memory and logic structures. The rcells are configured by interconnecting the various components through multiple layers of metal to allow for the creation of logic functions.

Flip-flop rcell memories are memories that are built from flip-flops and logical cells. Flip-flop rcell memories are often used for mapping memories having a very small number of words. Other memory types can also be used in alternative embodiments.

The memory timing model described below can be implemented with or modified for any of the above-described memory resources and other types of memory resources not mentioned.

B. Mapped Memory Wrapper

FIG. 1 is a diagram illustrating a mapped memory wrapper 10 with which an embodiment of the present invention can be used. When a customer memory is mapped to a memory resource, such as a matrix of standard RAM memories (e.g., RRAM), from a timing point of view, the memory can be substituted with mapped memory wrapper 10. Wrapper 10 includes a timing model 12 of the memory itself and a pair of delay models 14 and 16, which model the input and output timing delays resulting from the memory being mapped to a memory matrix (or other memory resource) and due to the particular manner in which the memory is tiled into the matrix memory (or other memory resource).

C. Memory Timing Model

One embodiment of the present invention provides a memory timing model having a flexible construction that simplifies memory timing handling as well as the generation of timing models regardless of whether the models are used for the memory itself or for wrappers with inserted delay modules, such as those shown in FIG. 1.

The memory timing model decomposes the customer memory to be simulated into parallel one-bit wide "atom" memories. If the customer memory has a width N and a capacity (number of words) C, then the customer memory is modeled as N one-bit wide memories having a capacity (number of one-bit "words") C, where n and C are positive integer variables. This decomposition simplifies timing violation handling and responses to hazard conditions for the entire memory.

The generation of memory timing models can be performed uniformly for an entire matrix RAM design, provided that timing constraints are available for all mapped memories. In addition, a tool for generating memory timing models with back-annotating can be built and implemented based on the memory timing models described herein.

In one exemplary embodiment, the memory timing model includes the following features, among others:
1. Two-port, two clock read-write memory
2. Bit read-write enable
3. Shadow write 4. Initial pre-loading from file
5. Dump memory content to file debug function
6. Extra parameter to incorporate errors
7. Warning messages
8. Read-write same address conflict resolving
9. X (unknown state) handling and response to hazard conditions
10. Back annotating timing support.

Figure 2:
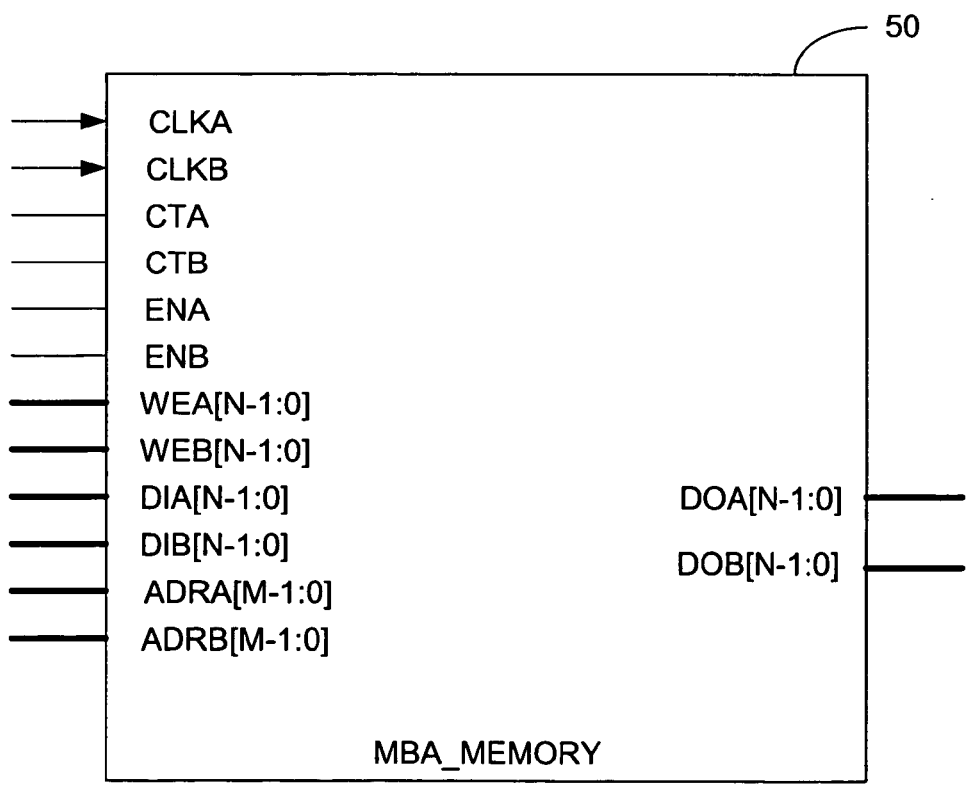
FIG. 2 is a diagram illustrating a memory timing model (labeled "MBA_MEMORY") according to one embodiment of the present invention.

FIG. 2 is a diagram illustrating a memory timing model 50 (labeled "MBA_MEMORY") according to one embodiment of the present invention, of a standard two-port memory. However, memory timing model 50 can be modified to have a single port or any number of multiple ports in alternative embodiments of the present invention, and can be synchronous or asynchronous. Memory timing model 50 has a similar interface and functionality to a standard two-port memory. In addition, memory timing model 50 has built-in mechanisms for handling unknown "X" states and for responding to various hazard conditions including setup/hold time violation hazards, clock pulse width/cycle time violations, and conflicts between read/write operations.

In FIG. 2, bus wires are illustrated with bold lines while one-bit wires are illustrated with regular lines. Table 1 defines the inputs and outputs of memory timing model 50.

TABLE 1

MBA MEMORY Signal Pinout

| Signal | Direction | Description |
|---|---|---|
| CLKA | Input | Clock to read and write operations through port A (rising edge) |
| CLKB | Input | Clock to read and write operations through port B (rising edge) |
| CTA | Input | Coupling test request for shadow write through port A (if High) |
| CTB | Input | Coupling test request for shadow write through port B (if High) |
| ENA | Input | Memory port A enable (request) |
| ENB | Input | Memory port B enable (request) |
| WEA [N − 1:0] | Input | Write enable bit mask request (port A) |
| WEB [N − 1:0] | Input | Write enable bit mask request (port B) |
| DIA [N − 1:0] | Input | Data input (port A) |
| DIB [N − 1:0] | Input | Data input (port B) |
| ADRA [M − 1:0] | Input | Address for read/write operations through port A |
| ADRB [M − 1:0] | Input | Address for read/write operations through port B |
| DOA [N − 1:0] | Output | Data output (port A) |
| DOB [N − 1:0] | Output | Data output (port B) |

In general, at each clock cycle, the memory module's port (either port A or port B depending on which input clock, CLKA or CLKB, is considered) can be in an active (enabled) or an inactive (disabled) state depending on the input enable signal (ENA or ENB). Port A and Port B are independently activated and inactivated. When enabled, i.e. ENA=1 for port A (or ENB=1 for port B), the data stored at the memory location specified by the input address ADRA (or ADRB) is outputted through the module's data output port DOA (or DOB). For each write enable input bit i, for which WEA[i]=1 (or WEB[i]=1) for i equals 0, 1 ... N-1, the data bit DIA[i] (or DIB[i]) presented at the module's data input port DIA (or DIB) is written into the memory location specified by address ADRA (or ADRB).

Using Boolean vector operations, the above functional description of the memory timing model can be written as:
DOA=MEMORY[ADRA]
MEMORY[ADRA]=(DIA&WEA)^(MEMORY[ADRA]& (~WEA)) for enabled port A, and
DOB=MEMORY[ADRB]
MEMORY[ADRB]=(DIB & WEB)^(MEMORY[ADRB]& (~WEB)) for enabled port B.

In the above description, MEMORY is an array representing the memory content. The size of this array (or maximum number of words that can be stored in the memory) is determined by the capacity (capacitance) of the memory being modeled.

In the test case of a shadow write, when CTA=1 (or CTB=1), the memory model has a different fucntionality, wherein DOA=DIA (or DOA=DIB) without affecting the memory content. Also, different functionality occurs in the case of performing read and write operations to the same memory address.

Table 2 defines parameters for the memory module shown in FIG. 2.

TABLE 2

MBA MEMORY Verilog Module's parameters

| Parameter | Default value | Description |
|---|---|---|
| Msize | 1024 | Number of memory words (memory capacity) |
| N | 32 | Width (number of bits) of the input WEA, WEB, DIA, DIB and output DOA, DOB signals |
| M | 10 | Address width |
| flags | 0 | Auxiliary parameter to incorporate errors into memory model for testing and debug purposes |
| MEMORYFILE | | Initial memory content pre-loading from the file (if specified) |

In one embodiment, the memory module is implemented in Verilog and table 2 illustrates the Verilog parameters for the memory module. Other parameters and default values can be used in alternative embodiments of the present invention.

In this example, the memory model has a default capacity of 1024 memory words, wherein each word has a width of 32 bits.

Figure 3:
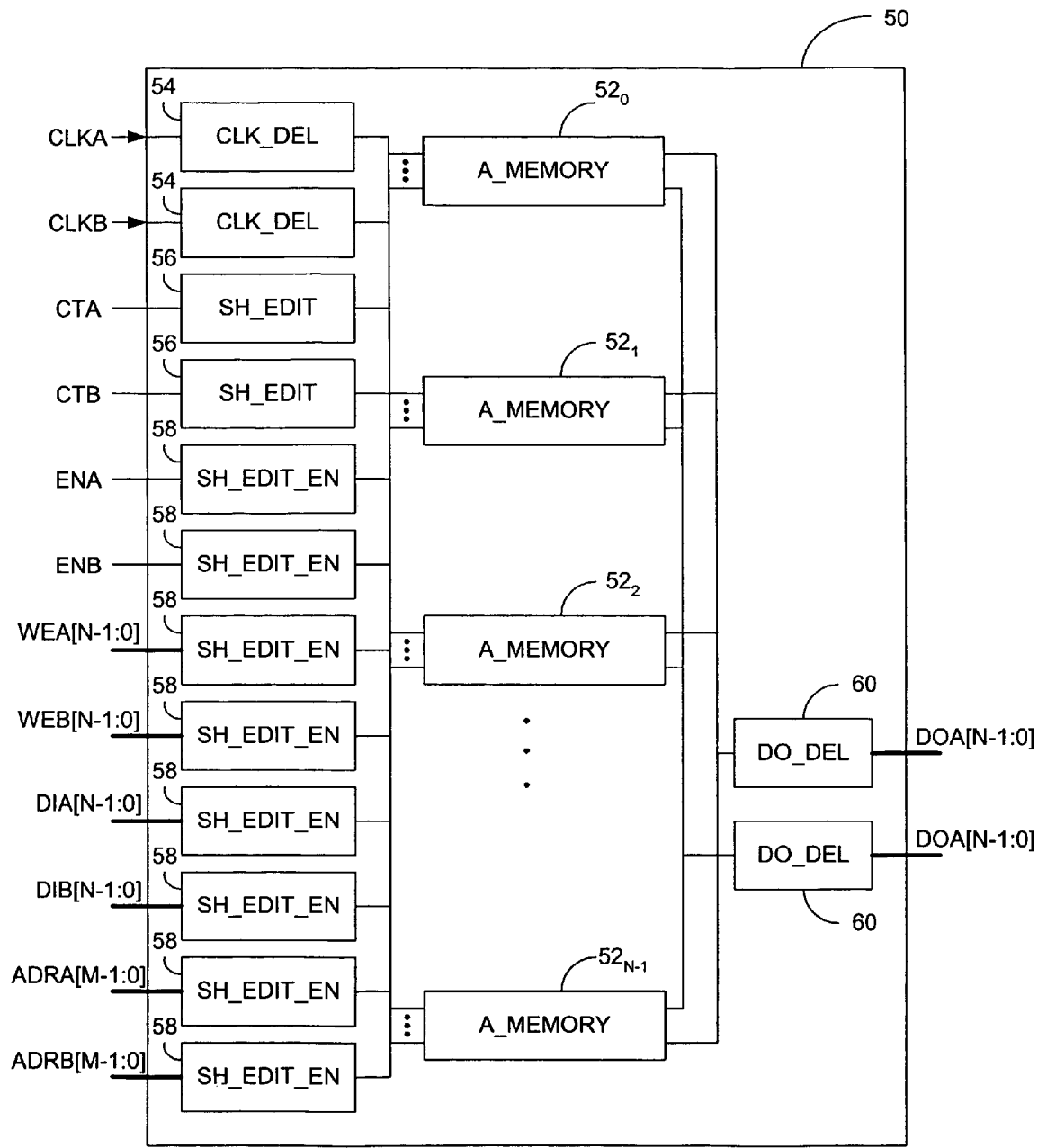
FIG. 3 is a block diagram of the memory timing module shown in FIG. 2 according to one embodiment of the present invention.

FIG. 3 is a block diagram illustrating memory timing module 50 (MBA_MEMORY) in greater detail in which the memory to be simulated is decomposed into N one-bit wide atom memories $52_0$ to $52_{N-1}$ (labeled "A_MEMORY"), where N is a positive integer variable representing the width of MBA_MEMORY. Each one-bit wide memory 52 has a capacity "C", which is equal to the capacity of MBA_MEMORY. For each bit i, for i equals 0, 1 ..., N-1 in MBA_MEMORY, one memory module $52_i$ (A_MEMORY) is instantiated.

Memory timing module 50 also includes a plurality of auxiliary (editing and delaying) modules, including CLK_DEL modules 54, SH_EDIT modules 56, SH_EDIT_EN modules 58 and DO_DEL modules 60, which are described in more detail below. There is one SH_EDIT_EN module 58 for each bit i of each multiple-bit bus, even though one module 58 is shown for each bus. Similarly, there is one DO_DEL module 60 for each bit i of data output buses DOA[N-1:0] and DOB[N-1:0]. All A_MEMORY modules 52 and all auxiliary modules 56, 58 and 60 are clocked by delayed versions of input clocks CLA and CLB, produced by CLK_DEL modules 54.

The clock shift (delay) is performed by a respective instance of CLK_DL 54 for each port (port A and port B). In one embodiment, the delay introduced by each CLK_DEL module 54 is defined so that all given (specified) setup and hold time violation regions relative to the original input clock (CLKA or CLKB) on the timeline precede the shifted (delayed) clock as shown in FIG. 4.

Figure 4:
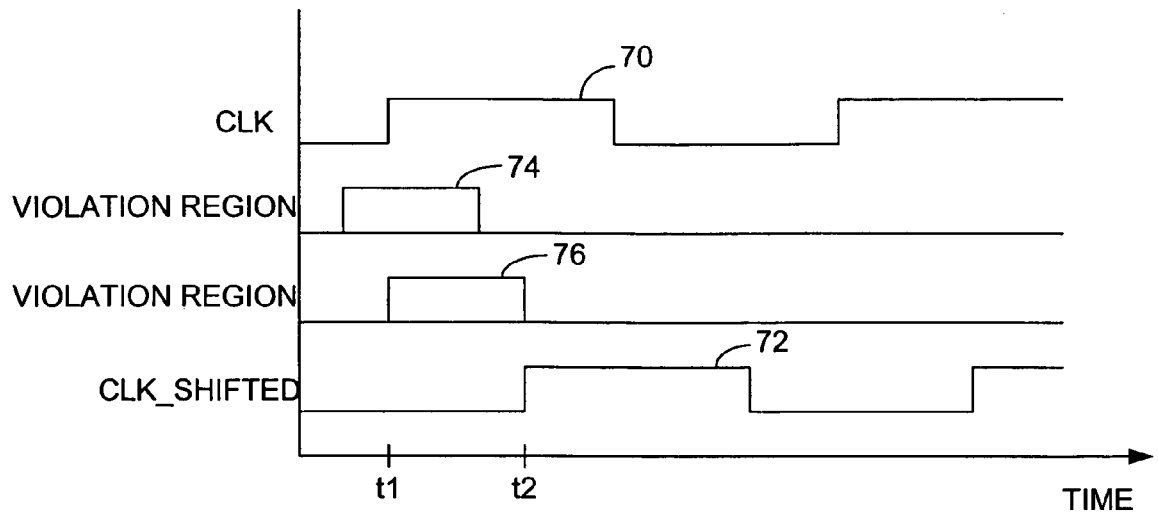
FIG. 4 is a waveform diagram illustrating shifting of an input clock by a clock monitor and delay module shown in FIGS. 3 and 7.

In FIG. 4, waveform 70 represents one of the input clocks CLK (CLK A or CLK B), and waveform 72 represents the shifted clock CLK_SHIFTED. Waveforms 74 and 76 represent specified setup and hold time violation regions for particular input signals relative to the rising edge (at time $t_1$) of CLK. The corresponding rising edge of CLK_SHIFTED is delayed until time $t_2$ such that all specified setup and hold time violation regions (e.g., 74 and 76) are located before the rising edge of CLK_SHIFTED. This aids in monitoring timing violations for each input signal within the SH_EDIT and SH_EDIT_EN modules, described below. At the rising edge of the original (not delayed) clock signal a hold time violation would not yet have occurred. Delaying the rising edge of the clock signal beyond the setup and hold time regions allows violations to be detected within the MBA_Memory. This also aids in detecting negative time constraints, wherein the rising edge of the input clock (not delayed) might occur before the start of the setup region.

Referring back to FIG. 3, the internal connections of MBA_MEMORY 50 are simplified for purposes of illustration. A detailed description of the inputs to each module in FIG. 3 is provided below with the description of that module. In the following discussion, WEA=WEA[i] WEB=WEB[i], DIA=DIA[i], DIB=DIB[i], DOA=DOA[i] and DOB=DOB[i].

Each instantiated A_MEMORY module $52_i$ is coupled to corresponding "edited" input signals of MBA_MEMORY 50. The SH_EDIT modules 56 are setup and hold time-driven signal editing modules, and the SH_EDIT_EN modules 58 are setup and hold time-driven signal editing modules having an enable signal EN. The basic purpose of editing modules SH_EDIT 56 and SH_EN_EDIT 58 is to detect timing violations and, in the case of a violation, to change (edit) the respective input signal to an unknown state "X". As described in more detail below, the A_MEMORY modules possess built-in functionality to process these "X" states and other hazard conditions to ensure correct responses to timing violations for the entire MBA_MEMORY 50.

The data output delay modules DO_DEL 60 provide the port A and port B data outputs DOA and DOB from memory MBA_MEMORY 50 according to given (specified) output timing specifications for these output signals.

D. Back-Annotating Timing Information

Timing information, such as delays, timing characteristics and timing constraints, can be back-annotated into modules of the memory timing model through explicit re-definition statements in the particular software program being used to model the memory. For example when using Verilog, the timing information can be back-annotated by using a Verilog "defparam" statement with the "instance (parameter)" hierarchical name for all parameters of the auxiliary modules described below. These parameters can be dependent upon setup and hold times for rising and falling input signals, input clock pulse widths and cycle times, and minimal and maximal delays for rising and falling output signals, for example.

These timing characteristics are generally specified by a delay and timing computational tool that is applied to the given integrated circuit design. Once these timing characteristics are determined by the appropriate tool or tools and stored in a timing database for the design, these characteristics can be back-annotated into the memory timing model.

The remaining sections provide more detailed descriptions of the modules instantiated in MBA_MEMORY 50.

E. Auxiliary One-Bit Memory Model A_MEMORY

1. Features

In one embodiment, each one-bit memory model 52 (A_MEMORY) has the following features:
Two-port two clock read-write memory;
1-bit memory width;
Warning messages;
X (unknown state) Handling;
Timing checks for input clocks; and
Read-write same address timing conflict resolution.

2. Functional Description

Figure 5:
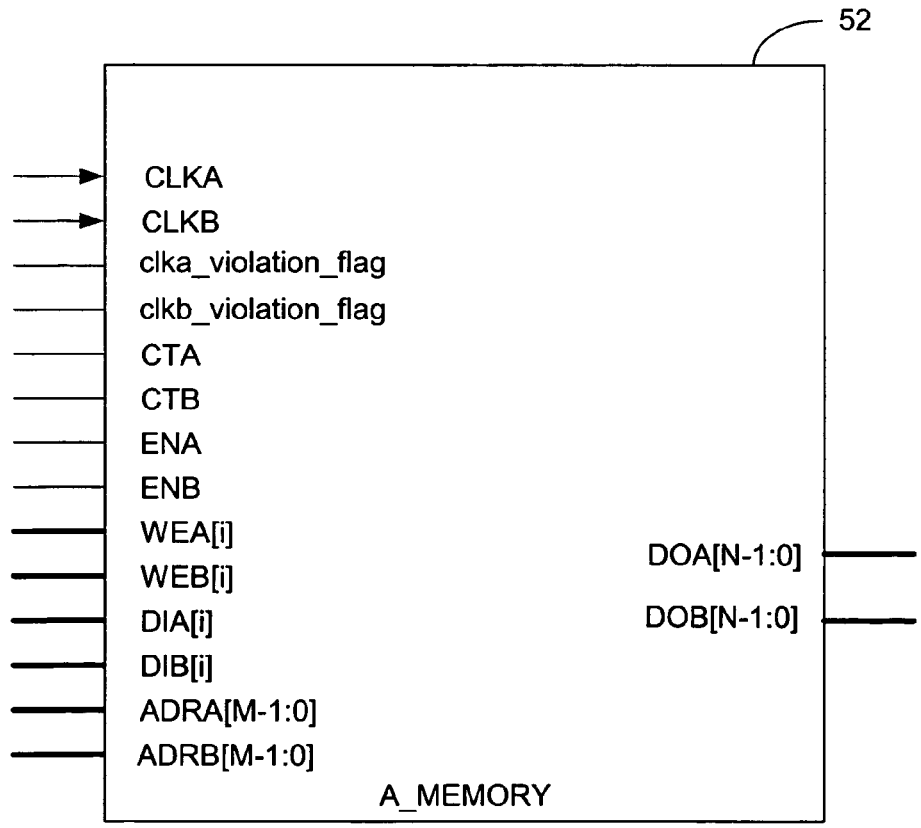
FIG. 5 is a diagram illustrating an atom memory module within the model shown in FIG. 3 according to one embodiment of the present invention.

FIG. 5 is a diagram illustrating the inputs and outputs of one of the A_MEMORY modules 52 according to one embodiment of the present invention. As mentioned above, A_MEMORY 52 is a one-bit wide two-port memory module having a similar function as a standard two-port memory. In addition, A_MEMORY 52 has extra functionality for handling unknown "X" states and for resolving same address read-write timing conflicts. It has two extra input signals, clka_violation_flag and clkb_violation_flag, for controlling timing violations (such as period and width violations) on input clocks CLKA and CLKB.

Essentially, if an input signal is in the "X" state when the clock input goes high, then a memory output and/or its content for a given input address are edited by changing the bit value to "X". In some cases, the entire memory is corrupted such that all bit values are changed to unknown "X" states. For example, period or width timing violations for input clock signals cause the entire one-bit memory (all addresses) to be corrupted and each bit value to be changed to "X".

Read-write same address timing conflicts in A_MEMORY 52 are also resolved in a similar manner.

3. Pinout Description

The signal names for the input and outputs of A_MEMORY 52 shown in FIG. 5 are described in Table 3.

TABLE 3

A MEMORY Signal Pinout

| Signal | Direction | Description |
|---|---|---|
| CLKA | Input | Clock to read and write operations through port A (rising edge) |
| CLKB | Input | Clock to read and write operations through port B (rising edge) |
| clka_violation_flag | Input | Period or width timing violation flag for input clock CLKA (if High) |
| clkb_violation_flag | Input | Period or width timing violation flag for input clock CLKB (if High) |
| ENA | Input | Memory port A enable (request) |
| ENB | Input | Memory port B enable (request) |

TABLE 3-continued

A MEMORY Signal Pinout

| Signal | Direction | Description |
| --- | --- | --- |
| WEA | Input | Write enable request (port A) |
| WEB | Input | Write enable request (port B) |
| DIA | Input | Data input (port A) |
| DIB | Input | Data input (port B) |
| ADRA [M − 1:0] | Input | Address for read/write operations through port A |
| ADRB [M − 1:0] | Input | Address for read/write operations through port B |
| DOA | Output | Data output (port A) |
| DOB | Output | Data output (port B) |

4. Parameter Description

A_MEMORY 52 has several programmable parameters that are described in Table 4. Each parameter can be programmed through Verilog defparam statements, for example, or left to its default value.

TABLE 4

A MEMORY Verilog module parameters

| Parameter | Default value | Description |
| --- | --- | --- |
| MSize | 1024 | Number of memory words (memory capacity) |
| M | 10 | Address width |
| T_ab | 1.162 | Time limit (in ns) between CLKA rising and CLKB rising that cause read-write same address conflict |
| T_ba | 1.162 | Time limit (in ns) between CLKB rising and CLKA rising that cause read-write same address conflict |

If clka_violation_flag or clkb_violation_flag is set to an active state, if the memory address is out of range, or if memory enable signals ENA or ENB are "X", A_MEMORY 52 replaces all one-bit "words" (all address locations in A_MEMORY 52) with an "X" state.

For read-write same address timing conflicts, the value of T_ab sets the time limit in nanoseconds between the rising edge of CLKA and the rising edge of CLKB for reading from and writing to the same address. If the time limit is less than T_ab, the memory output and/or the content at the specified address location is edited by replacing the bit value with an "X". In the case of a write/write same address conflict (where WEA and WEB are both active), the content at the specified memory location is changed (edited) by replacing the bit value with an "X". Otherwise, if only one of WEA and WEB are active, then only the corresponding output bit (DOA[i] if WEB is active, and DOB if WEA is active) is edited to an "X" state. The operation is similar for T_ba.

However, the parameters of MBA_MEMORY and the behavior of the memory model (such as what and when memory bits are edited or wiped out) can be adjusted to accurately reflect the behavior of a particular physical memory. The behavior and parameters discussed herein are provided as examples only.

F. Setup/Hold Timing Monitor Module SH_MONITOR

Figure 6:
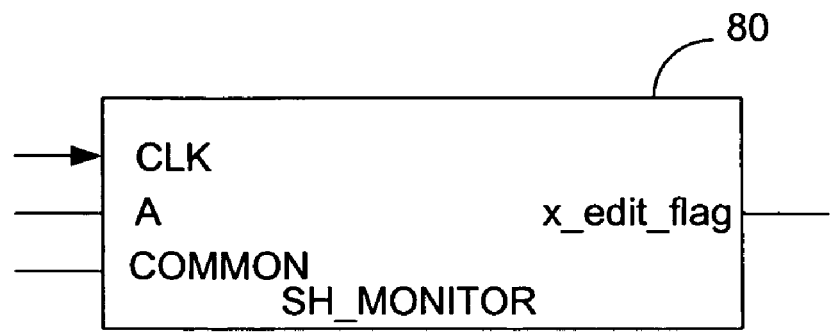
FIG. 6 is a block diagram illustrating a setup/hold timing monitor according to one embodiment of the present invention.

Referring back to FIG. 3, each SH_EDIT module 58 includes two instances of the set-up and hold timing monitor module SH_MONITOR 80 shown in FIG. 6. One instance performs a setup and hold timing check for rising input signals, and the other instance performs a setup and hold timing check for falling input signals.

1. Features

In one embodiment, each SH_MONITOR module 80 has the following features:

Setup and hold timing check monitoring;

Programmable timing control options; and

Support for rising or falling time checks.

2. Functional Description

SH_MONITOR module 80 is a timing monitoring module, which models a Verilog timing system task "$setuphold", for example. It controls a timing check for either a rising or falling input signal transition and supports (through Verilog defines) the following timing options:

NO_TCHK_MSG—prevents timing violation messages from displaying;

NO_NOTIFIER—prevents the notifier (x_edit_flag) from changing its value to indicate timing check violation; and NO_TIMING_CHECKS—disables timing checks.

These options are similar to the common Verilog plus options such as +no_tchk_msg, +no_notifier, and +notimingchecks used along with Verilog timing check system tasks.

Referring to the diagram shown in FIG. 6, clock input CLK is coupled to the respective clock input CLKA or CLKB corresponding to the particular enable signal being edited (ENA or ENB), as shown in FIG. 3. Input A is coupled to the respective enable input ENA or ENB. Auxiliary input signal COMMON is used to distinguish between falling and rising states on input A for the timing check being performed.

The output x_edit_flag is a timing violation notifier which, when activated, indicates that during a monitoring time window having a duration of T nanoseconds prior to the rising edge of input clock signal CLK, the input signal value applied to input A changed from a high state (for a falling timing check) or from a low state (for a rising timing check). SH_MONITOR module 80 resets x_edit_flag in T_rst_delta nanoseconds after the rising edge of the input clock CLK.

3. Pinout Description

Table 5 provides an description of each input and output signal of SH_MONITOR module 80.

TABLE 5

SH_MONITOR Signal Pinout

| Signal | Direction | Description |
| --- | --- | --- |
| CLK | Input | Clock to initiate timing check (rising edge) |
| A | Input | Input signal to be checked for timing violations |
| COMMON | Input | Auxiliary input signal to distinct between falling and rising cases of the timing check performed |
| x_edit_flag | Output | Timing violation notifier flag |

4. Parameter Description

SH_MONITOR module 80 has a plurality of programmable parameters, which are defined in table 6.

TABLE 6

SH_MONITOR Verilog Module Parameters

| Parameter | Default value | Description |
| --- | --- | --- |
| T | 0 | Duration (in ns) for monitoring time window (prior the rising edge of clock input signal) |
| T_rst_delta | 0 | Timing notifier flag restores value 0 (reset value) in T_rst_delta ns after rising edge of clock input signal |
| rising_falling_flag | 0 | Indicates rising or falling case in timing check |
| eps | 0.001 | Auxiliary parameter using for round up time (in ns) |

G. Setup and Hold Timing Monitor Module SH_EN_MONITOR.

Referring back to FIG. 3, each instance of SH_EDIT_EN module 58 includes two setup and hold timing monitor modules SH_EN_MODULE, similar to the SH_MONITOR module 80 shown in FIG. 6. Each SH_EN_MONITOR module is the same as the SH_MONITOR module 80, except each SH_EN_MONITOR module has an extra input signal EN (enable), and timing checks are performed only if EN if active (e.g., high).

H. Clock Period and Width Timing Monitor Module CLK_MONITOR

Figure 7:
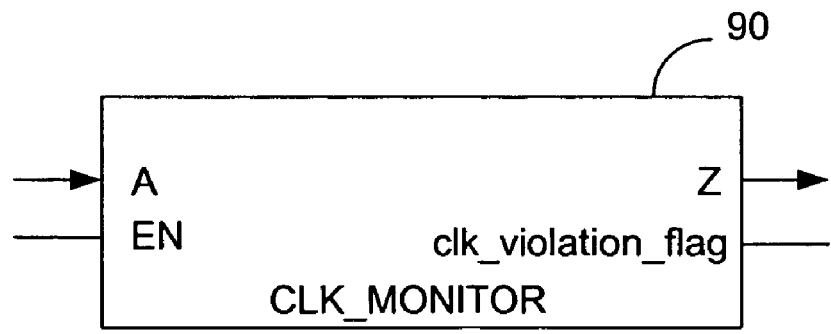
FIG. 7 is a block diagram illustrating a clock monitor and delay module according to one embodiment of the present invention.

Referring to FIG. 3, each CLK_DEL module 54 includes a clock period and width timing monitor module CLK_MONITOR 90, shown in FIG. 7.

1. Features

In one embodiment, each CLK_MONITOR module 90 has the following features:
Period and width timing check monitoring;
Programmable timing control options; and
Clock shifting.

2. Functional Description

CLK_MONITOR module 90 is a timing monitor module, which models Verilog timing system tasks "$period" and "$width", for example, for the input clock. Module 90 has an input A, which is coupled to the respective clock input (CLKA or CLKB) and has an enable input EN that enables clock timing checks. Module 90 receives the input clock signal on input A and shifts (delays) the input clock for T_shift nanoseconds on output Z. Module 90 also supports the NO_TCHK_MSG and NO_NOTIFIER timing options described above.

CLK_MONITOR module 90 asserts the timing violation notifier clk_violation_flag if the period or the width of the input clock signal CLK violates the parameters defined below. These timing checks are enabled only if enable signal EN is active (e.g., high).

The delayed clock signal generated on output Z is used as the internal clock (delayed CLKA or delayed CLKB) for all other modules within MBA_MEMORY 50.

3. Pinout Description

Table 7 describes the input and output signals of CLK_MONITOR 90, shown in FIG. 7.

TABLE 7

CLK_MONITOR Signal Pinout

| Signal | Direction | Description |
| --- | --- | --- |
| A | Input | Clock |
| EN | Input | Signal that enables clock timing checks |
| Z | Output | Clock shifted for T_shifts ns |
| clk_violation_flag | Output | Timing violation notifier flag |

4. Parameters Description

Table 8 describes the programmable parameters for CLK_MONITOR 90.

TABLE 8

SH_MONITOR Verilog Module Parameters

| Parameter | Default value | Description |
| --- | --- | --- |
| T_low_width | 0 | Parameter that control the minimal clock's wave Low stage width |
| T_low_width | 0 | Parameter that control the minimal clock's wave High stage width |
| T_period | 0 | Parameter that control the minimal clock's wave period |
| T_shift | 0 | Input clock shift (in ns) |

I. Output Timing Monitor Module DO_MONITOR.

Figure 8:
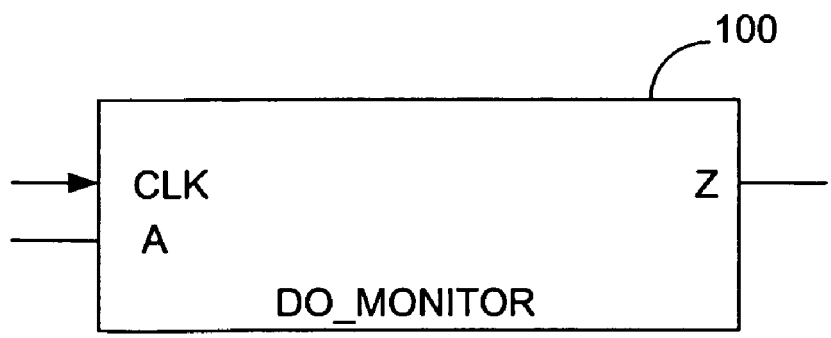
FIG. 8 is a block diagram illustrating a data output timing module according to one embodiment of the present invention.

Referring back to FIG. 3, each instance of data output delay module DO_DEL 60 includes a DO_MONITOR module 100, shown in FIG. 8.

1. Features

In one embodiment each DO_MONITOR module 100 has the following features:
Models the delay in the output computation;
Programmable timing control options (Verilog defines); and
Separate output windows for rising and falling signals.

2. Functional Description

DO_MONITOR 100 is a timing monitoring module, which models minimal and maximal delays in the output signal computation relative to the positive edge of the clock input CLK. Clock input CLK is coupled to the delayed input clock signal (delayed CLKA or delayed CLKB). Input A is coupled to the output of the respective port (port A or port B) of the respective A_MEMORY module 52 for the corresponding output bit. There is one DO_MONITOR module 100 instance for each bit of data outputs DOA[N-1:0] and DOB[N-1:0] (shown in FIG. 3). DO_MONITOR 100 generates a respective time window mask Z_mask for a rising input signal and for a falling input signal and generates the output signal on output Z as a logical exclusive-OR of the input signal applied to input A and the time window mask. The resulting output signal is therefore available (in a known state) only beyond the time window mask.

Figure 9:
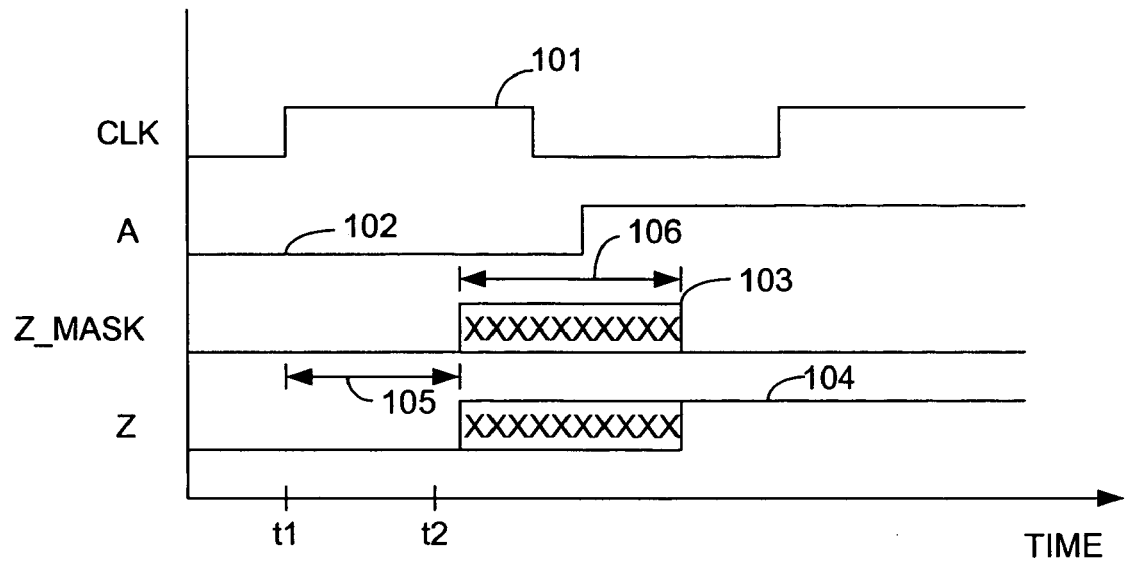
FIG. 9 is a waveform diagram illustrating sample waveforms for the data output timing module shown in FIG. 8.

FIG. 9 is a waveform diagram illustrating sample waveforms for DO_MONITOR module 100. Waveform 101 represents the input clock signal CLK, waveform 101 represents the signal A (DOA[i] or DOB[i]), waveform 103 represents the location and width of the time window mask Z_MASK, and waveform 104 represents the output signal Z. As can be seen by waveform 104 DO_MONITOR module 100 masks output signal Z during the time window defined by Z_MASK. During this time window, output Z is set to an unknown "X" state.

DO_MONITOR module also supports the NO_TIMING_CHECKS timing option, which disables the time window mask.

3. Pinout Description

Table 9 defines the signal names of the DO_MONITOR module 100 shown in FIG. 8.

TABLE 9

DO_MONITOR Signal Pinout

| Signal | Direction | Description |
| --- | --- | --- |
| CLK | Input | Clock |
| A | Input | Memory Output Signal |
| Z | Output | Masked output |

4. Parameters Description

Table 10 defines the programmable parameters for DO_MONITOR 100 shown in FIG. 8.

TABLE 10

DO_MONITOR Verilog Module Parameters

| Parameter | Default value | Description |
| --- | --- | --- |
| T_d_min_r | 0 | Parameter that controls the time window location for rising input signal |
| T_d_x_r | 0 | Parameter that controls the timing window width for rising input signal |
| T_d_min_f | 0 | Parameter that controls the time window location for falling input signal |
| T_d_x_f | 0 | Parameter that controls the timing window width for falling input signal |
| T_do_ready | 0 | Delay to catch value of input signal A |
| T_do_release | 0 | Shift of input signal A to be changing within time window |

Looking at FIG. 9, arrow 105 represents the parameters T_d_min_r/T_d_min_f that control the time window location for the rising/falling input signals. Arrow 106 represents the parameters T_d_x_r/T_d_x_f that control the timing window width for rising/falling input signals.

Parameter T_do_ready defines the delay from the rising edge of CLK at which the value of input signal A is captured. The parameter T_do_release represents the shift of input signal A to output signal Z such that output signal Z changes states (i.e., is released) within the time window 103 for both rising and falling edges.

J. X Handling Module SH_EDIT

Figure 10:
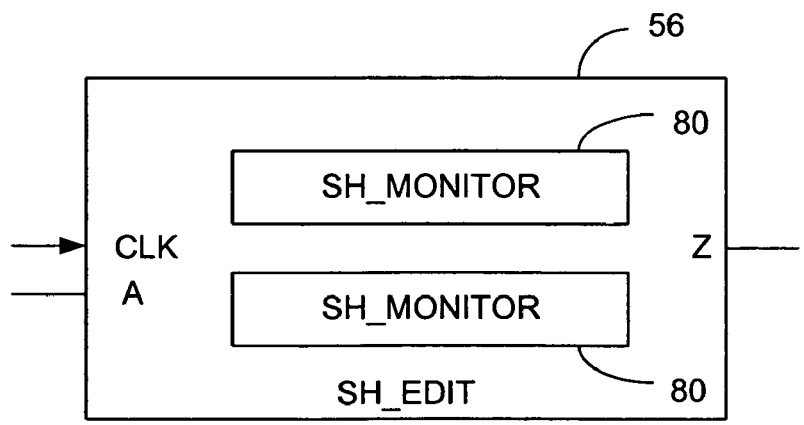
FIG. 10 is a block diagram illustrating a setup/hold edit timing edit module according to one embodiment of the present invention.

FIG. 10 is a block diagram illustrating one of the SH_EDIT modules 56 (shown in FIG. 3) in greater detail.

1. Features

In one embodiment, each SH_EDIT module 56 has the following features:
Setup and hold time violation modeling;
Programmable Timing Control Options (Verilog defines); and
Separate "X" (unknown state) handling for rising and falling signals.

2. Functional Description

The SH_EDIT module 56 is a Verilog "X" handling module, which edits (changes) the input signal applied to input A in the case of a setup or hold time violation being detected relative to the clock signal (delayed CLKA or CLKB) that is applied to clock input CLK. The SH_REDIT module 56 includes two instances of the setup and hold time monitor module SH_MONITOR 80, one for performing setup and hold time checks for rising input signals and the other for performing setup and hold time checks for falling input signals. If a setup or hold violation is detected, the SH_MONITOR module 80 that detected the violation sets its x_edit_flag signal high, which, in turn, causes SH_EDIT module 56 to replace the input signal with an "X" state on output Z. Otherwise, SH_EDIT module 56 passes the input signal unchanged from input A to output Z.

Figure 11:
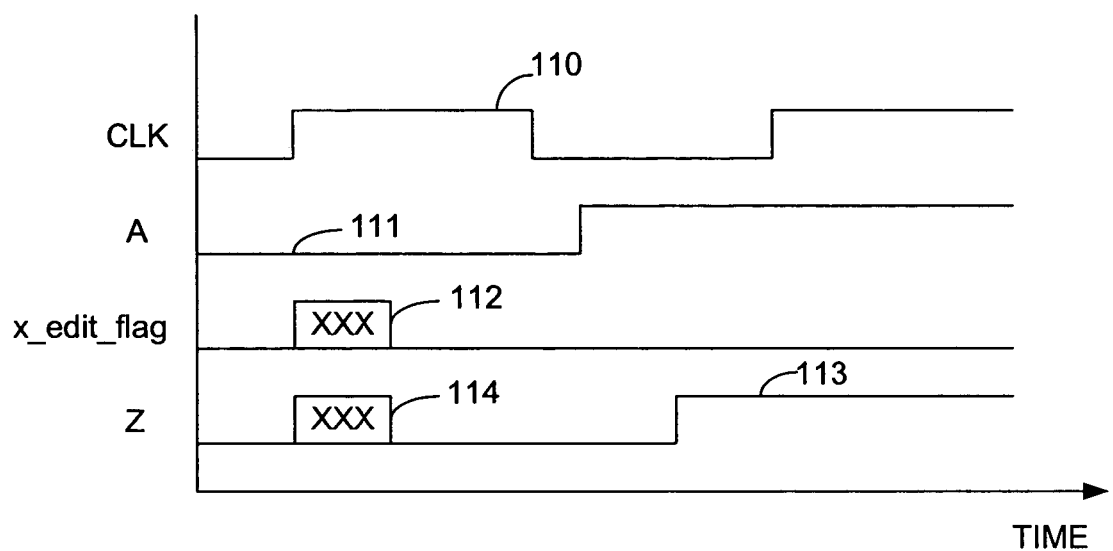
FIG. 11 is a waveform diagram illustrating example waveforms for the module shown in FIG. 10.

FIG. 11 is a waveform diagram illustrating example waveforms for SH_EDIT module 56. Waveform 110 represents the input clock signal CLK, waveform 111 represents the input signal A, waveform 112 represents the x_edit_flag and waveform 114 represents the output signal Z. When x_edit_flag is high, output Z is forced to an unknown "X" state, such as at 114, regardless of the value of the input signal A.

3. Pinout Description

Table 11 describes the input and output signals of SH_EDIT module 56.

TABLE 11

SH_EDIT Signal Pinout

| Signal | Direction | Description |
| --- | --- | --- |
| CLK | Input | Clock |
| A | Input | Memory Input Signal |
| Z | Output | Edited output |

4. Parameters Description

Table 12 defines the programmable parameters for SH_EDIT module 56.

TABLE 12

SH_EDIT Verilog Module Parameters

| Parameter | Default value | Description |
| --- | --- | --- |
| T_shift_r | 0 | Shift (delay) for rising input signal |
| T_shift_r | 0 | Shift (delay) for falling input signal |
| T_r | 0 | Setup + hold time constraint for rising signal |
| T_f | 0 | Setup + hold time constraint for falling signal |
| T_shift_common | 0 | Delay to catch value of input signal A |
| T_rs_delta | 0 | High pulse width for x-edit_flat signal |

K. X Handling Module SH_EDIT_EN

The SH_EDIT_EN module is similar to the SH_EDIT module but has an extra input signal EN (enable), which is passed to the instantiated SH_EN_MONITOR module for enabling setup and hold timing checks, which are performed only if EN is high.

L. DO_DEL and CLK_DEL Modules

These two modules are simply wrappers around the corresponding modules DO_MONITOR and CLK_MONITOR describe above.

M. Exemplary Computing Environment

Figure 12:
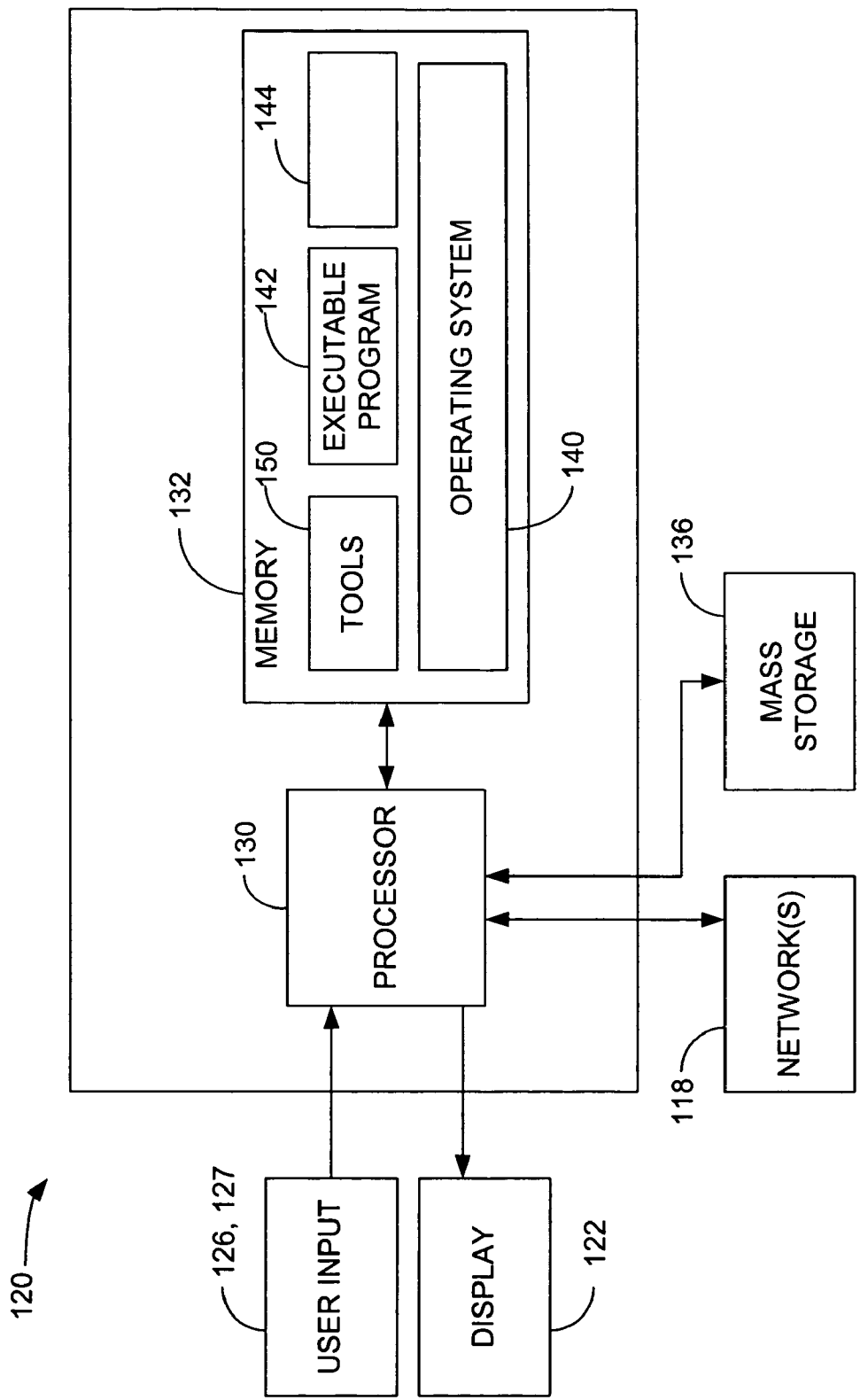
FIG. 12 is a block diagram of a computing device upon which one or more of models, model components or timing characteristics could be installed or used.

FIG. 12 is a block diagram of a computing device 120 upon which one or more of the tools, models, model components or timing characteristics could be installed or used, fully or partly.

Computing device 120 may represent practically any type of computer, computing system, or other programmable electronic device, including a client computer, a server computer, portable computer, an embedded controller, a hand-held device, etc. Computing device 120 may be coupled in a network or may be a stand-alone device.

Computing device 120 typically includes at least one processor 130 coupled to a memory 132. Processor 130 may represent one or more processors or microprocessors and memory 132 may represent the random access memory (RAM) devices comprising the main storage of computing device 120, as well as any supplemental levels of memory such as cache memories, nonvolatile or backup memories, programmable or flash memories, read-only memories, etc. In addition, memory 132 may be considered to include memory storage physically located elsewhere in computing device 120, e.g., any storage capacity used as a virtual memory, e.g., as stored on a mass storage device 36 coupled to device 120 with a SAN or on another computer coupled to device 120 via network 18.

Computing device 120 may operate under the control of any suitable operating system 140. Operating system 140 typically executes various computer software applications, components, programs, objects, modules, etc., such as an executable program 142 and/or other components 144. Although the memory timing model, modules and timing database used to implement one or more embodiments of the present invention may be in memory 132, they need not be. The processor 130 may access external tools, any required data, other various applications components, programs, objects, modules, etc., resident on one or more processors or storage devices associated with other computing devices coupled to computing device 120 via a network.

In general, the various tools executed to estimate the timing characteristics, generate a model for the memory to be simulated or back-annotate the timing characteristics and any associated timing constraints into the model are referred to as design tools, whether implemented as part of an operating system or a specific application, database, component, program, object, module or sequence of instructions. The design tools typically comprise one or more instructions or databases that are resident at various times in various memory and storage devices in a computer, and that, when read and executed by one or more processors in a computer network, cause that computer to perform the instructions and/or process the databases or modules embodying the various aspects of the invention. Examples of computer readable media on which such instructions, models and/or modules can be stored include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. The exemplary environment illustrated in FIG. 12 is not intended to limit the present invention.

N. Summary

The MBA_MEMORY module described above provides a timing model in which timing characteristics and constraints can be back-annotated into the model for providing accurate timing modeling for memories that are mapped to memory resources, such as reconfigurable matrix RAM. The module provides an accurate reflection of the input and output memory signal delays and provides adequate responses to hazard conditions in a design that propagates these conditions to its memories. The memory timing model has a flexible construction that simplifies memory timing handling as well as the generation of a timing model regardless of whether the model is generated for the memory itself or for a mapped memory wrapper with inserted delay modules.

Although the present invention has been described with reference to illustrative embodiments, workers skilled in the art will recognize that changes may be made in form and detail without departing from the scope of the invention. The particular examples provided above are provided for illustration purposes only. Numerous modifications can be made in alternative embodiments of the present invention. For example, individual auxiliary models can be combined or further separated, and each module can handle any number of bits and control signals. Individual signals can be added or eliminated in alternative embodiments. The term coupled as used in the specification and claims can include a direct connection or a connection through one or more intermediate components. Also, signals can be active high or active low, and any signal or state can be logically inverted.

What is claimed is:

1. A memory timing model recorded on a computer-readable memory and comprising:
    an address input;
    a multiple-bit data input and data output;
    a programmable capacity C and width N;
    N one-bit wide memory modules instantiated in parallel with one another between respective bits of the data input and the data output, each memory module having a capacity of C bits addressed by the address input.

2. The memory timing model of claim 1 and further comprising:
    a respective edit module coupled between each data input bit and the respective one-bit wide memory module, which selectively changes a state of the respective data input bit to an unknown state as a function of a timing constraint.

3. The memory timing model of claim 2 and further comprising:
    a memory enable input and a write enable input coupled to each memory module; and
    a respective edit module coupled between each memory enable input, write enable input and address input and the N memory modules, which selectively change a state of the respective input to the unknown state as a function of the timing constraint.

4. The memory timing model of claim 2 and further comprising a clock input coupled to each memory module and each edit module and wherein each edit module comprises:
    a programmable time window, which is defined relative to the clock input, and wherein the edit module is adapted to change the state of the respective data input bit to the unknown state if the respective data input bit changes from a first logic state to a second logic state during the time window.

5. The memory timing model of claim 4 wherein each edit module further comprises:
a further programmable time window, which is defined relative to the clock input, and wherein the edit module is adapted to change the state of the respective data input bit to the unknown state if the respective data input bit changes from the second logic state to the first logic state during the further time window.

6. The memory timing model of claim 4 and further comprising:
a clock delay module coupled between the clock input and having a delayed clock output coupled to the N memory modules and the edit modules, which shifts the delayed clock output from the clock input by a programmable delay.

7. The memory timing model of claim 6 wherein the programmable delay is programmed such that all of the programmable timing windows precede each active edge of the delayed clock output.

8. The memory timing model of claim 1 and further comprising:
a clock input coupled to each memory module;
a clock monitor module coupled to the clock input and comprising a clock constraint parameter and a clock violation flag, wherein the clock monitor module activates the clock violation flag when the clock input violates the clock constraint parameter.

9. The memory timing model of claim 8 wherein each memory module comprises a clock violation flag input, which is coupled to the clock violation flag and is adapted to replace the C bits in the memory module with unknown states when the clock violation flag is active.

10. The memory timing model of claim 1 wherein, during a write operation, if the address input comprises at least one address bit having an unknown state, the memory timing model is adapted to replace the C bits in all the memory modules with unknown states.

11. The memory timing model of claim 1 and further comprising:
a multiple bit data output; and
a respective data output module coupled between each memory module and a respective data output bit, wherein each data output module comprises a programmable time window, which is defined relative to the clock input and outputs an unknown state to the respective data output bit during the time window.

12. A method of creating a memory timing model for a memory device, the method comprising:
inputting a capacity C and a width N for the memory device; and
instantiating N one-bit wide memory modules in parallel with one another between respective bits of a multiple-bit data input and a multiple-bit data output of the memory timing model, each memory module having a capacity of C bits addressed by an address input to the memory timing model.

13. The method of claim 12 and further comprising:
instantiating a respective edit module between each data input bit and the respective one-bit wide memory module, wherein each edit module is adapted to selectively change a state of the respective data input bit to an unknown state or pass the data input bit to the respective memory module with an unchanged state as a function of a timing constraint; and
inputting the timing constraint to the edit module as a programmable parameter.

14. The method of claim 13 wherein the memory timing model comprises a memory enable input and a write enable input and the method further comprises:
instantiating a respective edit module between the memory enable input, the write enable input and each bit of the address input and the N memory modules, wherein each edit module is adapted to selectively change a state of the respective input to an unknown state or pass the respective input to the respective memory module with an unchanged state as a function of the timing constraint; and
inputting the timing constraint to the respective edit module as a programmable parameter.

15. The method of claim 13 wherein the time constraint defines a programmable time window relative to a clock input to the memory model, and wherein each edit module is adapted to change the state of the respective data input bit to an unknown state if the respective data input bit changes from a first logic state to a second logic state during the time window.

16. The method of claim 15 wherein the time constraint defines a further programmable time window relative to the clock input, and wherein the edit module is adapted to change the state of the respective data input bit to an unknown state if the respective data input bit changes from the second logic state to the first logic state during the further time window.

17. The method of claim 15 and further comprising:
instantiating a clock delay module in the model, which is coupled to the clock input and has a delayed clock output coupled to the N memory modules and the edit modules, and which shifts the delayed clock output from the clock input by a programmable delay; and
inputting a value for the programmable delay to the clock delay module such that all of the programmable timing windows precede each active edge of the delayed clock output.

18. The method of claim 12 and further comprising:
instantiating a clock monitor module, which is coupled to a clock input of the memory timing model and defining a clock violation flag that becomes active when the clock input violates a clock constraint parameter;
inputting a value for the clock constraint parameter; and
providing the clock violation flag as an input to each memory module, wherein each memory module is adapted to replace the C bits in the memory module with unknown states when the clock violation flag is active.

19. The method of claim 12 and further comprising:
instantiating a respective data output module between each memory module and a respective data output bit, wherein each data output module comprises a programmable time window, which is defined relative to a clock input and outputs an unknown state to the respective data output bit during the time window.

20. A computer-readable memory comprising a memory timing model recorded on the computer-readable memory, wherein the memory timing model comprises an address input, a multiple-bit data input and data output, a capacity C, a width N, and N one-bit wide memory modules instantiated in parallel with one another between respective bits of the data input and the data output, each memory module having a capacity of C bits addressed by the address input.

21. A memory timing model recorded on a computer-readable memory and comprising:
an address input;
a multiple-bit data input and data output;
a programmable capacity C and width N;

N one-bit wide memory modules instantiated in parallel with one another between respective bits of the data input and the data output, each memory module having a capacity of C bits addressed by the address input; and a respective edit module coupled between each data input bit and the respective one-bit wide memory module, which selectively changes a state of the respective data input bit to an unknown state as a function of a timing constraint.

22. A memory timing model recorded on a computer-readable memory and comprising:

an address input;

a multiple-bit data input and data output;

a programmable capacity C and width N;

N one-bit wide memory modules instantiated in parallel with one another between respective bits of the data input and the data output, each memory module having a capacity of C bits addressed by the address input;

a clock input coupled to each memory module; and a clock monitor module coupled to the clock input and comprising a clock constraint parameter and a clock violation flag, wherein the clock monitor module activates the clock violation flag when the clock input violates the clock constraint parameter.

23. The memory timing model of claim 22 wherein each memory module comprises a clock violation flag input, which is coupled to the clock violation flag and is adapted to replace the C bits in the memory module with unknown states when the clock violation flag is active.

24. A memory timing model recorded on a computer-readable memory and comprising:

an address input;

a multiple-bit data input and data output;

a programmable capacity C and width N; and

N one-bit wide memory modules instantiated in parallel with one another between respective bits of the data input and the data output, each memory module having a capacity of C bits addressed by the address input, wherein, during a write operation, if the address input comprises at least one address bit having an unknown state, the memory timing model is adapted to replace the C bits in all the memory modules with unknown states.

25. A memory timing model recorded on a computer-readable memory and comprising:

an address input;

a multiple-bit data input and a multiple-bit data output;

a programmable capacity C and width N;

N one-bit wide memory modules instantiated in parallel with one another between respective bits of the data input and the data output, each memory module having a capacity of C bits addressed by the address input; and a respective data output module coupled between each memory module and a respective data output bit, wherein each data output module comprises a programmable time window, which is defined relative to the clock input and outputs an unknown state to the respective data output bit during the time window.

* * * * *